United States Patent [19]

Schuster et al.

[11] Patent Number: 5,000,827
[45] Date of Patent: Mar. 19, 1991

[54] METHOD AND APPARATUS FOR ADJUSTING PLATING SOLUTION FLOW CHARACTERISTICS AT SUBSTRATE CATHODE PERIPHERY TO MINIMIZE EDGE EFFECT

[75] Inventors: Virgil E. Schuster; Reginald K. Asher, Sr., both of Scottsdale; Bhagubhai D. Patel, Tempe, all of Ariz.

[73] Assignee: Motorola, Inc., Schaumburg, Ill.

[21] Appl. No.: 459,892

[22] Filed: Jan. 2, 1990

[51] Int. Cl.$^5$ .............................................. C25D 5/02
[52] U.S. Cl. ..................................................... 204/15
[58] Field of Search ........................................... 204/15

[56] References Cited

U.S. PATENT DOCUMENTS 4,287,029 9/1981 Shimamura ............................ 204/15

FOREIGN PATENT DOCUMENTS 28039 3/1978 Japan .
123089 5/1989 Japan .
198017 8/1989 Japan .
242797 9/1989 Japan .

Primary Examiner—T. M. Tufariello
Attorney, Agent, or Firm—Charles R. Lewis; Walter W. Nielsen

[57] ABSTRACT

A method and apparatus for electroplating metallized bumps of substantially uniform height on predetermined terminal areas of a substrate. Cup plating apparatus includes elements for adjusting parameters affecting the geometry of the substrate relative to the plating cup, as well as flow rate of the electroplating solution against the substrate surface. By achieving non-laminar flow of the electroplating solution near the substrate edges, the plating characteristics of the electroplating solution are altered in this region, substantialy offsetting "edge effect", so that the resulting plated bump height is substantially uniform across the substrate.

2 Claims, 7 Drawing Sheets

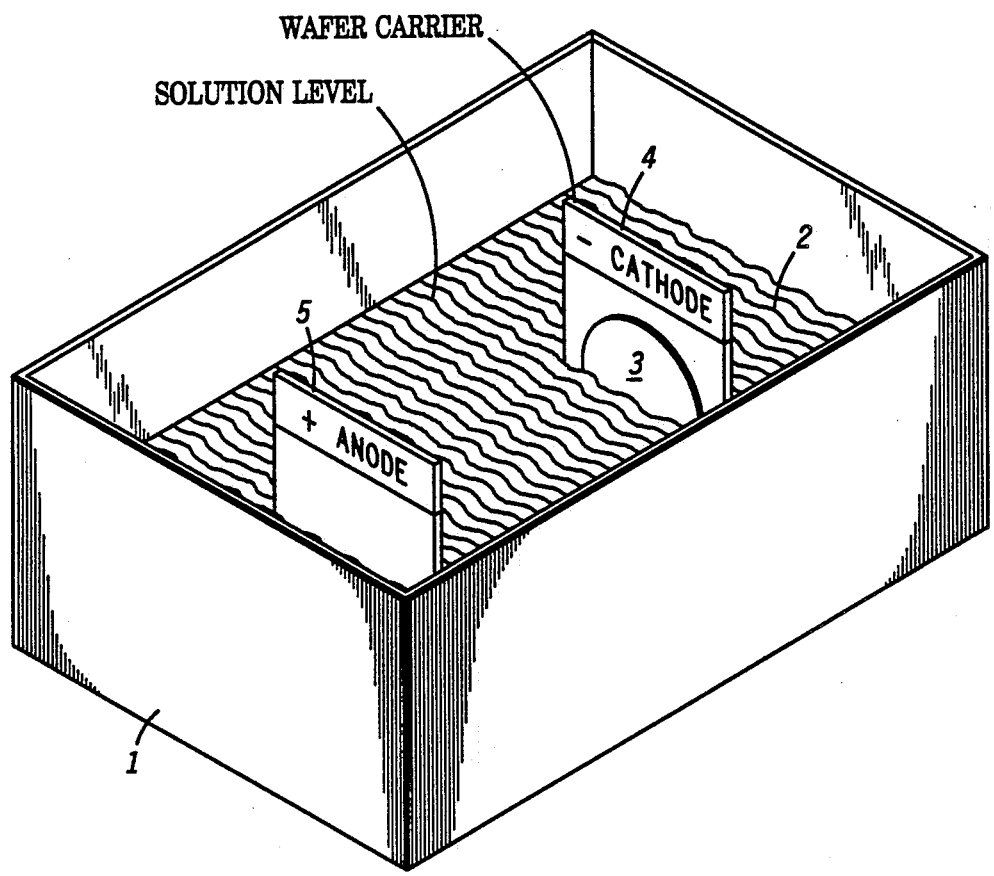
FIG. 5
—PRIOR ART—
FIG. 8
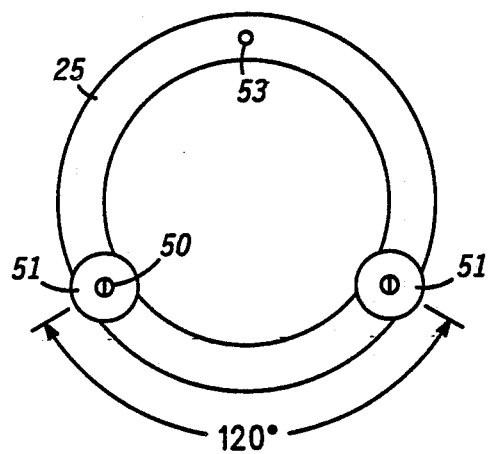

METHOD AND APPARATUS FOR ADJUSTING PLATING SOLUTION FLOW CHARACTERISTICS AT SUBSTRATE CATHODE PERIPHERY TO MINIMIZE EDGE EFFECT

BACKGROUND OF THE INVENTION

1. Technical Field of the Invention

This invention relates generally to the manufacture of micro-electrical circuits, and, more particularly, to the formation of uniform-thickness metallization bumps on terminal areas of electrical circuits on a substantially planar substrate, particularly near the edge thereof.

2. Background Information

The present invention has utility in the plating of metallization bumps on predetermined terminal areas of silicon wafers prior to scribing such wafers into a plurality of individual die.

FIG. 1 shows a silicon wafer 3 upon which a plurality of individual electrical circuit elements 6 are formed. The electrical characteristics of individual circuit elements 6 may be imparted to them by employing any suitable process(es) therefor. The specifics of the electrical circuit of the circuit elements 6 lies outside of the scope of the present invention.

FIG. 2 shows a view similar to that shown in FIG. 1, wherein the wafer 3 has been separated into pieces 7 including at least one die 8 using conventional wafer scribing or sawing techniques.

FIGS. 3A show steps in the formation of a terminal region 19 on a surface of an individual die 8, prior to wafer scribing or sawing, and the plating of a metallization bump onto such terminal region 19. In the manufacture of a particular electrical product from die 8, such as the double-slug diode shown in FIG. 4, it is frequently necessary to deposit a metallized bump in a predetermined area of a surface of such die.

Referring to FIG. 3A, a representative individual die 8 of wafer 3 is shown overlaid with a layer of oxide 38, and a hole or window 18 has been etched through the oxide 38 down to a terminal area (not shown) of the underlying substrate 28.

In FIG. 3B, the window 18 of FIG. 3A has been filled with top metal 19. In a preferred embodiment of the invention, the top metal 19 actually comprises three layers: first a layer of titanium, next a layer of nickel, and finally a layer of silver. Again, the composition of the layers and thickness thereof are not specific to the present invention.

In FIG. 3C, a metallization bump, comprising a layer of silver 14 and a layer of tin 15, has been electro-deposited over the top metal terminal region 19.

FIG. 4 shows a double-slug diode manufactured according to the method and apparatus disclosed by the present invention. The diode of FIG. 4 is shown for illustrative purposes only, and it should be understood by all practitioners in the art that the present invention has broad utility in many metallization bump processing applications and is not intended to be limited to implementations such as that shown in FIGS. 3 and 4.

Still with reference to FIG. 4, the die 8 has been separated from its counterparts on wafer 3 and mounted between copper "slugs" or terminals 16 and 17 to which electrical leads 41 and 42, respectively, have been affixed. The entire assembly is enclosed in glass 9.

FIG. 5 shows a prior art plating apparatus for plating metallization bumps onto predetermined terminal areas of a silicon wafer, such as terminal area 19 of die 8. Referred to as a rack plating apparatus, it comprises a tank 1 of electroplating solution into which an anode 5 and a cathode 4 are shown partially submersed. It will be understood that anode 5 and cathode 4 are shown partially submersed for ease in understanding and that during operation they are substantially submersed.

Anode 5 has a potential having a positive polarity coupled thereto, while cathode 4 has a potential having a negative polarity coupled thereto.

Affixed to cathode 4 is a substantially planar, conductive wafer 3 comprising a plurality of individual electrical elements (not shown), each with a terminal area such as terminal area 19 shown in FIG. 3B. It will be understood by those skilled in the art that substrate 3 may itself serve as the cathode 4, or substrate 3 may be suitably affixed to a wafer carrier, which serves as the cathode 4.

FIG. 6 is a graph illustrating the variation of bump height across a silicon wafer electroplated with the prior art plating apparatus shown in FIG. 5. The bump height in microns measured on selected die is provided along the Y-axis, and the die position across a given wafer diameter is provided along the X-axis. It will be observed that the X-axis of FIG. 6 is non-linerar, in that emphasis is given to die numbers closest to the wafer edge, for example die numbers 1-5 at the left edge and die number 184-188 at the right edge.

It is seen that when metallized bumps are plated with the apparatus shown in FIG. 6 there is substantial variation in bump height across the wafer diameter. The bumps are highest at or near the wafer edge. For example, the bump height 11 of die #1 is 70 microns, and that of die #188 is approximately 58 microns, whereas that of die #120 is approximately 41 microns.

According to the graph of FIG. 6, the bump height variation across a typical 9.65 centimeter diameter wafer is almost 30 microns, ranging from a minimum of 41 microns at die #120 to a maximum of 70 microns at die #1. This greatly exceeds a desired production specification width of 20 microns.

The increased electroplating intensity near the wafer edge is commonly referred to as "edge effect".

Therefore, there is a substantial need to provide an electroplating method and apparatus which overcomes the "edge effect" problem known in prior electroplating systems.

Various electroplating systems are known which have attempted to overcome the "edge effect". One such system is referred to as a cathode-mask system, in which the high-growth area of the substrate is masked. However, this system suffers from the need to achieve critcal positioning of the mask relative to the high-growth area of the substrate. Both the alignment of the mask and the mask-to-wafer spacing are critical and difficult to control.

BRIEF SUMMARY OF INVENTION

The present invention solves the problem of "edge effect" by selectively altering the metallic ion concentration of the electroplating solution near the edge(s) of the wafer substrate.

According to the present invention, the electroplating solution is contained in a cup-shaped container. A pump circulates the solution through an inlet and out over the lip of the cup. The wafer is suspended at an optimum height above the cup lip. The cup diameter is optimized relative to the wafer diameter and to the area in which undue bump growth occurs. In addition, the flow rate of solution through the plating cup is optimized. By optimizing the above-mentioned parameters, the metallic ion concentration of the electroplating solution in the vicinity of the wafer edge(s) is optimized to just offset the "edge effect", and to provide substantially uniform height of electroplated bumps across the wafer diameter.

Accordingly, it is an object of the present invention to provide an electroplating method and apparatus which produce metallized bumps of substantially uniform height across a substrate including the edge(s) thereof.

Thus a greater proportion of die fall within desired specifications, resulting in lower rejection rates, lower material and labor charges, higher quality, and greater customer acceptance.

It is another object of the present invention to provide an electroplating method and apparatus which is relatively inexpensive and which is relatively easy to control.

It is yet another object of the present invention to provide an electroplating method and apparatus which eliminates the labor-intensive steps of mounting a substrate on a wafer carrier prior to electrodepositing the metallized bumps, demounting the substrate from the wafer carrier after deposition, and cleaning the mounting agent (typically wax, glycol, or plastic) from the substrate.

These and other objects are achieved in accordance with a preferred embodiment of the invention by providing a method of forming metallization bumps on predetermined terminal areas of a planar substrate, the bumps being of substantially uniform height across the substrate, wherein the method comprises (a) providing a planar substrate having thereon a multiplicity of terminal areas; (b) applying an electrical potential having a first electrical polarity to the terminal areas; (c) applying an electrical potential having a second electrical polarity to an electrical terminal immersed in a container of an electroplating solution; (d) exposing the substrate to the electroplating solution to permit the growth of the metallization bumps on the terminal areas; and (e) controlling the growth of the metallization bumps in a predetermined region of the substrate by altering the metallic ion concentration of the electroplating solution in the predetermined region.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 5 shows a prior art plating apparatus for plating metallization bumps onto predetermined terminal areas of a silicon wafer.

FIG. 8 shows a top-view of ring element 25 and adjustable wafer support elements 51 of the plating apparatus shown in FIG. 7.

DESCRIPTION OF PREFERRRED EMBODIMENT

Figure 7:
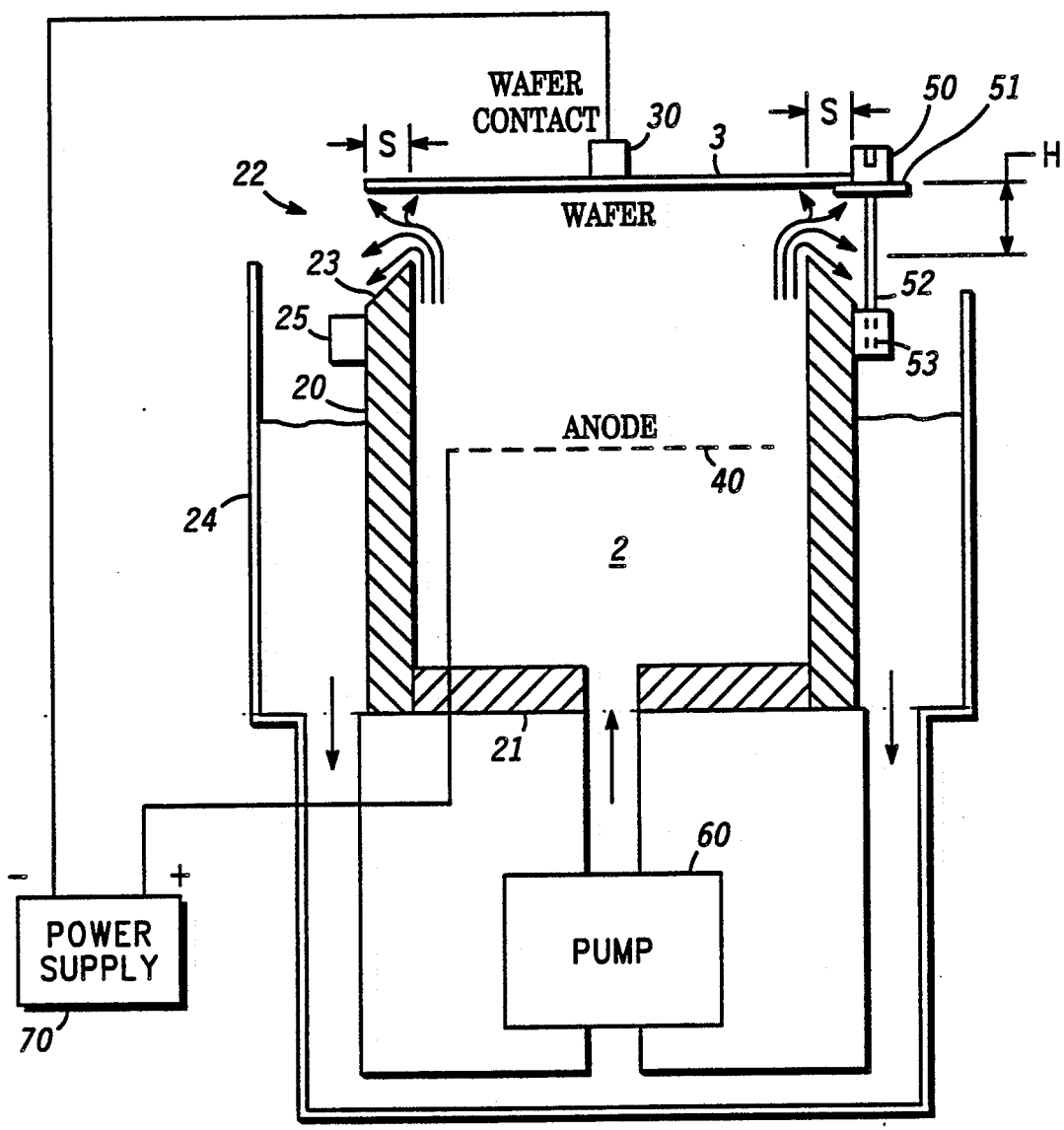
FIG. 7 shows a cross-sectional view of apparatus for plating metallization bumps of substantially uniform height onto predetermined terminal areas of a silicon wafer, according to the present invention.

FIG. 7 shows apparatus for plating metallization bumps of substantially uniform height onto predetermined terminal areas of a silicon wafer, according to the present invention. A cylcindrical cup 20 of suitable material, such as polyvinylchloride (PVC) or polypropylene, contains the desired electroplating solution, which in a preferred embodiment is a cyanide silver plating solution. The bottom portion of cup 20 may be formed integrally therewith or may be formed separately, as shown by bottom portion 21.

Pump 60 circulates the plating solution 2 through an inlet in the bottom cup 20, and plating solution 2 exists cup 20 over the lip 23 into tank or sump 24, from which it is eventually returned to the inlet side of pump 60.

To a suitable power supply 70, such as a pulsing DC rectifier, are coupled a wafer contact 30 and an anode 40. Anode 40 may take the form of a platinum-clad tantalum screen immersed in the electroplating solution. Wafer contact 30 may take the form of a silver-clad nickel element which rests upon or is affixed to the upper surface of water or substrate 3. Wafer 3 functions as a cathode.

Wafer 3 is supported by several wafer support members 51 suitably mounted in a ring or collar member 25 around the periphery of cup 20 (refer to FIG. 8). Support member 25 may take the form of a PVC washer mounted on a PVC screw 52, having a slotted head 50, and being threaded into a mating opening 53 in ring 25.

FIG. 8 shows a top-view of ring element 25 and adjustable wafer support elements 51 of the plating apparatus shown in FIG. 7. In a preferred embodiment, three wafer support elements 51 are spaced substantially equidistantly around the periphery of ring 25, and each has a slotted head to facilitate adjusting the height of wafer 3 above the lip 23 of cup 20.

Operation of Preferred Embodiment

In operation, as mentioned above, electroplating solution 2 flows generally upwards from the inlet in the bottom of cup 20, against the underside of wafer 3, and out over the lip 23 into sump 24.

Cup plating apparatus is known in the art and, as used, suffers from the well-known "edge effect". However, according to the present invention the metallic ion concentration of electroplating solution 2 is altered in the region near the edge of wafer 3, so as to effectively offset the "edge effect".

By creating non-laminar flow of the electroplating solution 2 through the opening between the lip 23 and lower surface of wafer 3, the plating characteristics of solution 2 near the edge are altered from those elsewhere within cup 20. The plating effect of the solution is weakened, thereby offsetting the tendency for increased plating effect near the cathode edge. The precise reasons as to why turbulent flow of the electroplating solution 2 against the outer portions of wafer 3 causes an offsetting of the "edge effect" are not completely understood.

To produce the non-laminar flow over the optimum peripheral area of wafer 3, the distance S between the outer edge of wafer 3 and the inner surface of cup 20 should be optimized. The parameter S is changed by changing the diameter of cup 20 relative to the diameter of wafer 3. By decreasing the diameter, a relatively greater peripheral area of wafer 3 is affected by a slight reduction in bump growth rate, whereas increasing the diameter of cup 20 diminishes the peripheral area of wafer 3 which is affected. In a preferred embodiment of the invention, the diameter of the wafer was 9.65 centimeters, and the inside diameter of the cup was 8.89 centimeters.

Another important dimension which should be optimized is the distance H between the lower surface of wafer 3 and the top of cup lip 23. If H is too low, laminar flow apparently results, and there is relatively little offsetting of the "edge effect", resulting in relatively higher bumps near the edge. As H is increased, turbulent flow apparently results, perhaps due to the capillary attraction of the bottom surface of wafer 3 near the edge, and there is increased offsetting of the "edge effect", resulting in edge bumps which are nearly identical in height to bumps elsewhere across the wafer diameter (refer to FIG. 10).

Flow rate through the plating cup 20 was found not to be a critical parameter. In a preferred embodiment, a flow rate of 4 to 5 liters/minute was employed.

Figure 1:
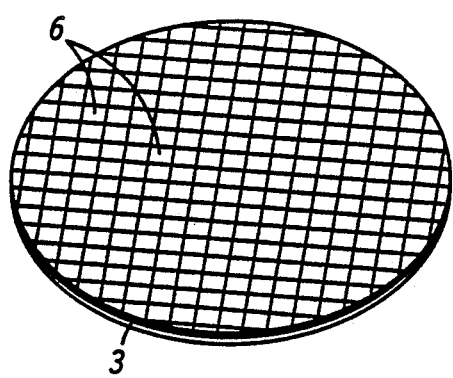
FIG. 1 shows a silicon wafer upon which a plurality of individual electrical circuit elements are formed.
Figure 2:
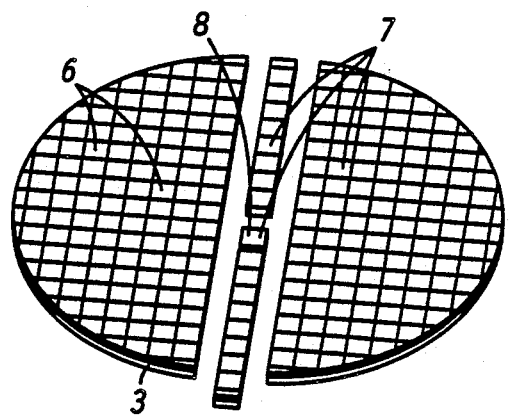
FIG. 2 shows a view similar to that shown in FIG. 1, wherein the wafer has been separated into pieces including at least one die.
Figure 3A:
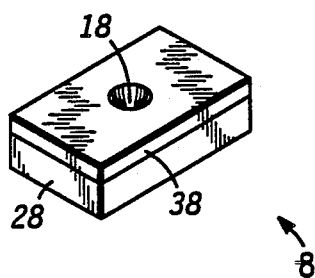
FIGS. 3A, 3B and 3C show steps in the plating of a metallization bump onto a terminal area of an individual die.
Figure 3B:
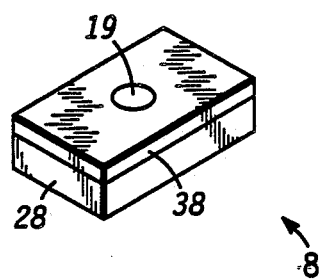
Figure 3C:
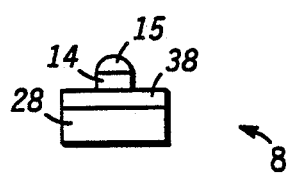
Figure 4:
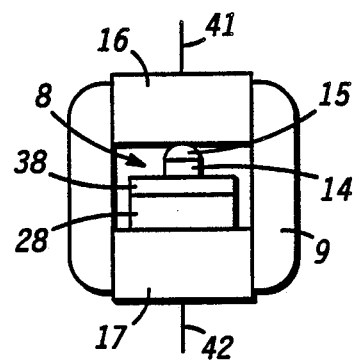
FIG. 4 shows a double-slug diode manufactured according to the method and apparatus disclosed by the present invention.
Figure 6:
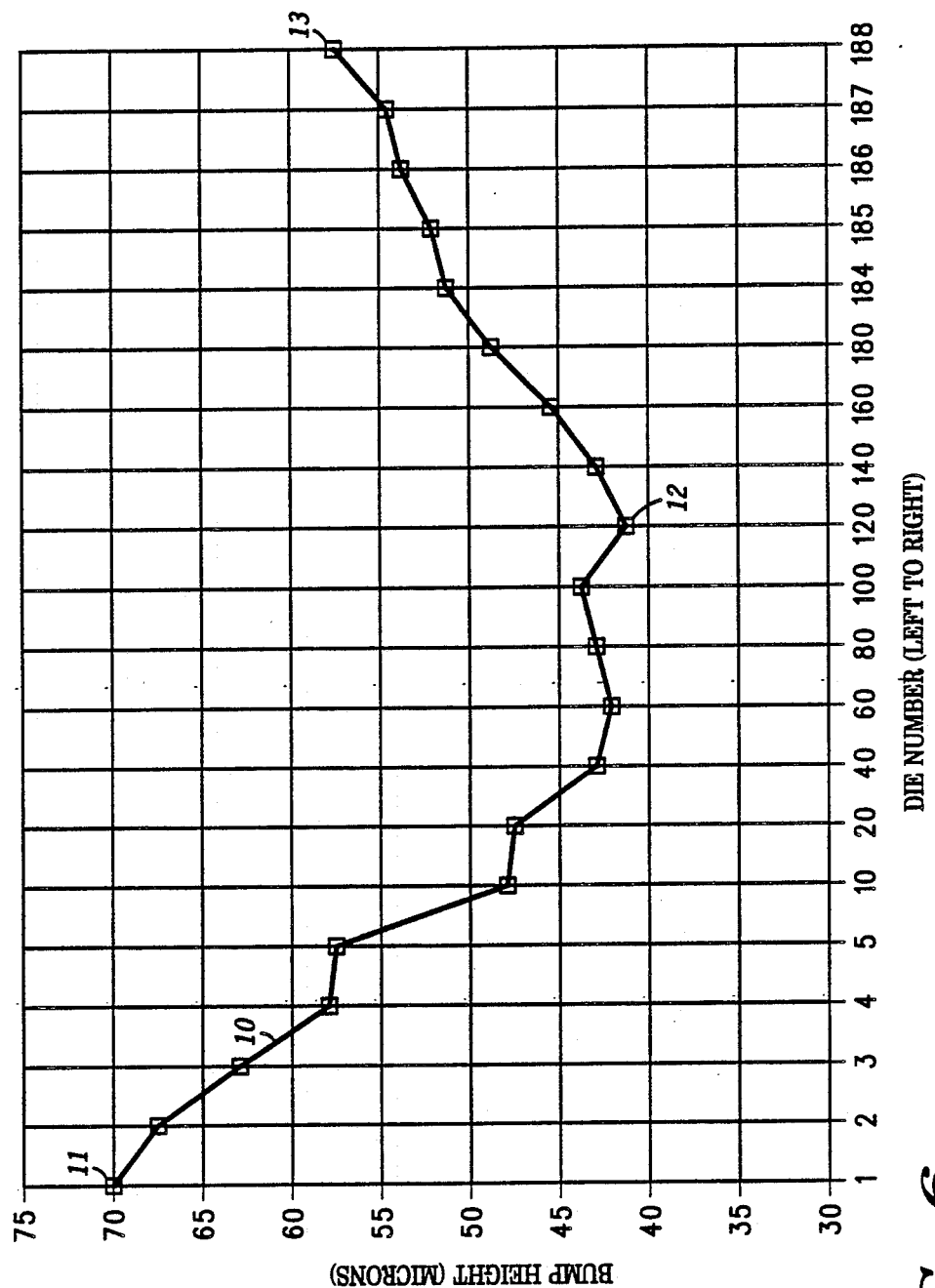
FIG. 6 is a graph illustrating the variation of bump height across a silicon wafer electroplated with the prior art plating apparatus shown in FIG. 5.

The invention described herein was used successfully to plate bumps comprising an initial layer of silver and a subsequent layer of tin, resulting in metallization bumps substantially as depicted in FIG. 3C.

Figure 9:
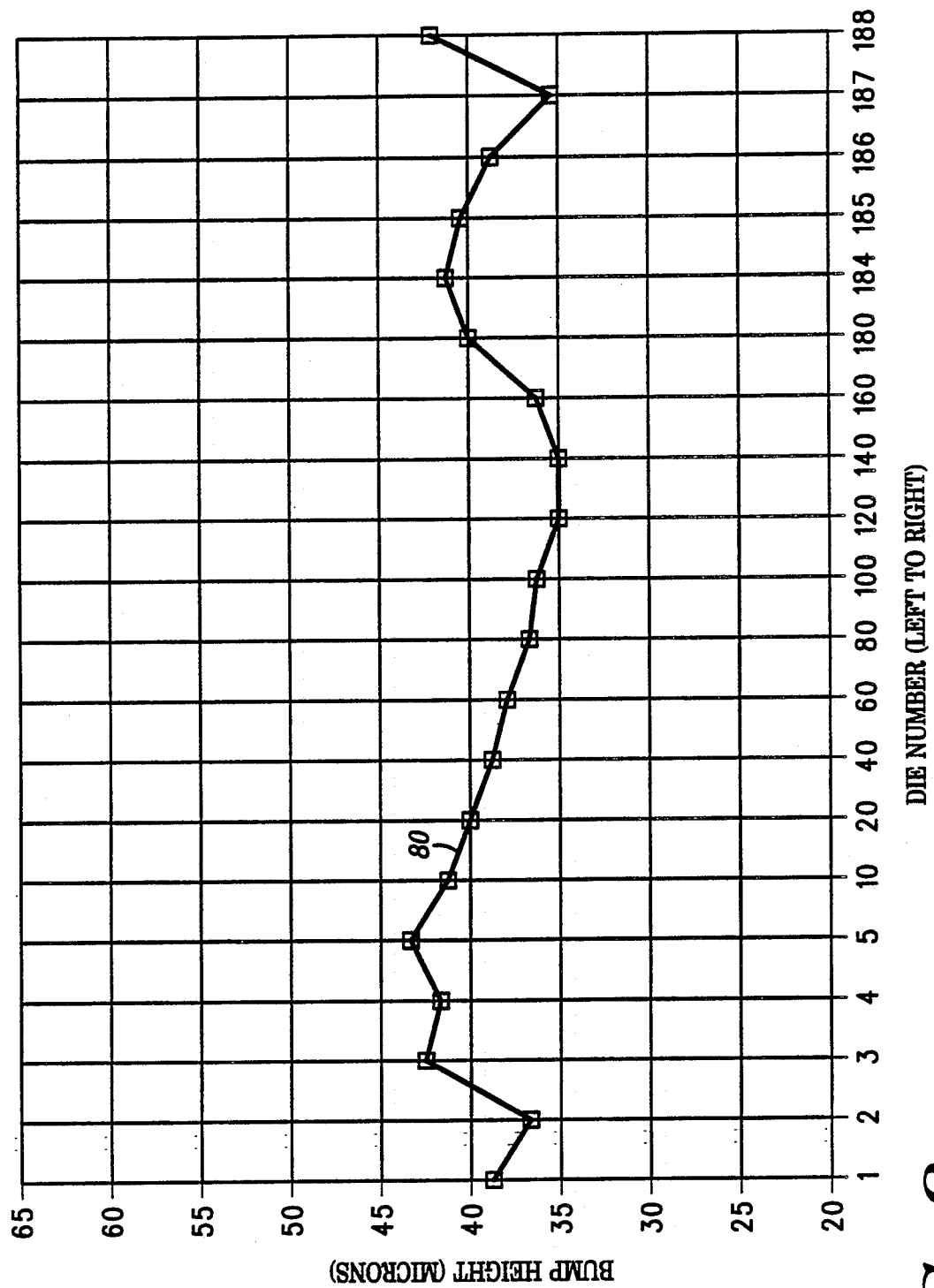
FIG. 9 is a graph illustrating the variation of bump height across a silicon wafer electroplated according to the method of the present invention.

FIG. 9 is a graph illustrating the variation of bump height across a silicon wafer electroplated according to the method of the present invention. To produce the results illustrated in FIG. 9, the height H of wafer 3 above the lip 23 of cup 20 was set at 2.25 millimeters. This produced a bump height variation across the wafer ranging from a high of 43 microns to a low of 35 microns (i.e. with a process variation of approximately 8 microns), which is well within a desired specification width of 20 microns.

Figure 10:
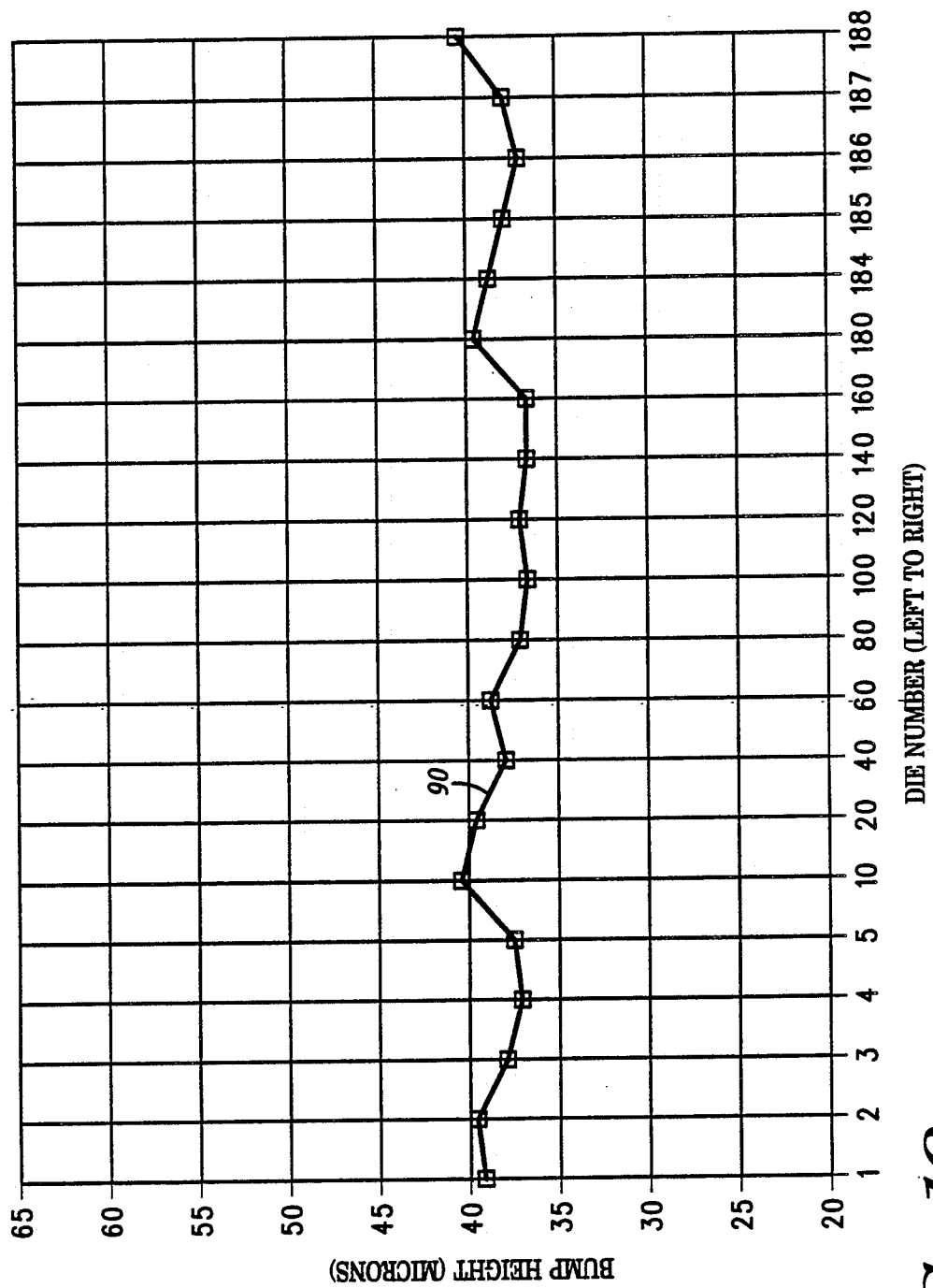
FIG. 10 is another graph illustrating the variation of bump height across a silicon wafer electroplated according to the method of the present invention.

FIG. 10 is another graph illustrating the variation of bump height across a silicon wafer electroplated according to the method of the present invention. By raising the height H of wafer 3 above the lip 23 of cup 20 to 2.45 millimeters, the bump height variation across the wafer ranged from a high of 40 microns to a low of 36 microns (i.e. with a process variation of approximately 4 microns). This is a substantial improvement over the process variation of 30 microns produced by the known tank electroplating method.

Description of Alternative Embodiment

Figure 11:
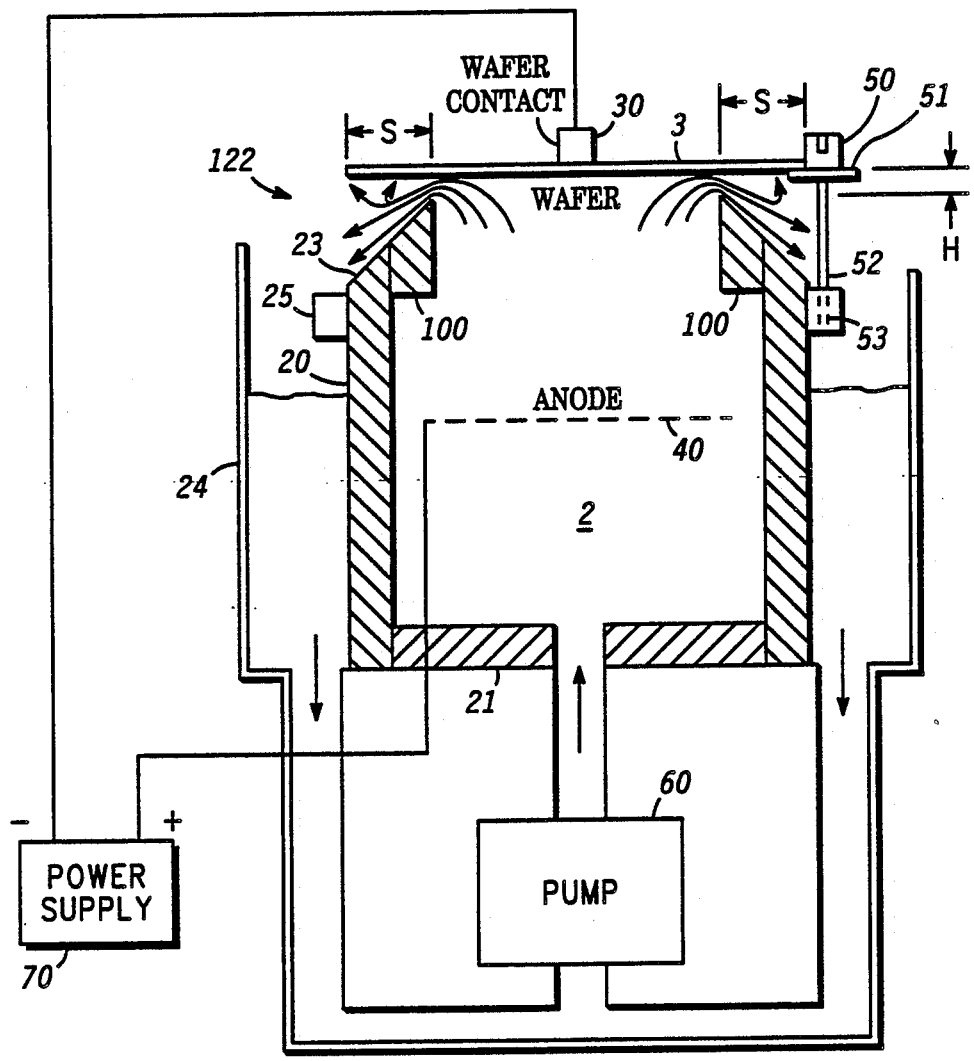
FIG. 11 shows a cross-sectional view of an alternative embodiment of apparatus for plating metallizaton bumps of substantially uniform height onto predetermined terminal areas of a silicon wafer, according to the present invention.

FIG. 11 shows an alternative embodiment of apparatus for plating metallization bumps of substantially uniform height onto predetermined terminal areas of a silicon wafer, according to the present invention.

The apparatus illustrated in FIG. 11 differs from that shown in FIG. 7 only in that the distance S between the outer edge of wafer 3 and the inner surface of cup 20 has been increased through the use of an annular ring 100 suitably secured within the lip portion 23 of cup 20. This is shown merely as one example of how the distance S may be altered.

It will be apparent to those skilled in the art that the disclosed invention may be modified in numerous ways and may assume many embodiments other than the preferred form specifically set out and described above.

For example, the present invention can be extended to electroplating of ceramic substrates. It may also be extended to electroplating metals other than those mentioned herein. The plating cup may take the form of a pipe or other suitable geometric shape.

Accordingly, it is intended by the appended claims to cover all modifications of the invention which fall within the true spirit and scope of the invention.

What is claimed is:

1. A method of forming metallized bumps on predetermined terminal areas of a planar substrate, said bumps being of substantially uniform height across said substrate, wherein said method comprises:
   (a) providing a planar substrate having thereon a multiplicity of terminal areas;
   (b) applying an electrical potential having a first electrical polarity to said terminal areas;
   (c) applying an electrical potential having a second electrical polarity to an electrical terminal immersed in a container of an electroplating solution;
   (d) exposing said substrate to said electroplating solution to permit the growth of said metallization bumps on said terminal areas;
   (e) controlling the growth of said metallization bumps in a predetermined region of said substrate by altering the metallic ion concentration of said electroplating solution in said predetermined region;
   (f) providing said container with an opening whose shape approximates that of said substrate;
   (g) positioning said substrate proximate to said container opening;
   (h) providing an inlet within said container for pumping said solution into said container, said solution exiting said container through said opening;
   wherein said metallic ion concentration of said electroplating solution is changed by:
   (i) in step (f) altering the size of said opening;
   (j) in step (g) altering the distance of said substrate from said container opening; and
   (k) in step (h) altering the flow rate of said solution through said opening.

2. The method of according to claim 1, wherein said metallization bumps comprise metal selected from the group consisting of silver and tin.

* * * * *